United States Patent
Sakurai

(10) Patent No.: US 7,928,889 B2
(45) Date of Patent: Apr. 19, 2011

(54) ANALOG-TO-DIGITAL CONVERTER, SOLID-STATE IMAGING DEVICE INCLUDING THE SAME, AND METHOD OF DIGITIZING ANALOG SIGNAL

(75) Inventor: Satoshi Sakurai, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/606,283

(22) Filed: Oct. 27, 2009

(65) Prior Publication Data
US 2010/0103017 A1    Apr. 29, 2010

(30) Foreign Application Priority Data

Oct. 27, 2008   (JP) ................................ 2008-275566

(51) Int. Cl.
H03M 1/56 (2006.01)
(52) U.S. Cl. ..................................... 341/169; 341/155
(58) Field of Classification Search .................. 341/169, 341/155, 156, 157, 168, 118, 120; 345/75.2, 345/75.1, 76
See application file for complete search history.

(56) References Cited

U.S. PATENT DOCUMENTS
6,906,648 B1 *   6/2005   Koike ........................... 341/118

OTHER PUBLICATIONS
U.S. Appl. No. 12/834,270, filed Jul. 12, 2010, Sakurai, et al.
Woodward Yang et al., "An Integrated 800×600 CMOS Imaging System", ISSCC99/Session 17/Paper WA 17.3, ISSCC Digest of Technical Papers, Feb. 1999, 3 pages.

* cited by examiner

Primary Examiner — Joseph Lauture
(74) Attorney, Agent, or Firm — Oblon, Spivak, McClelland, Maier & Neustadt, L.L.P.

(57) ABSTRACT

An analog-to-digital converter receives first and second analog signal voltages, and first and second comparison voltages. The first and second comparison voltages decrease by the same fixed inclination from a first reference voltage to below the first signal voltage and from a second reference voltage to below the second signal voltage, respectively. The converter counts cumulatively over first periods to acquire a first result, counts cumulatively over second periods to acquire a second result, and outputs a difference between the first and second results as a digital quantity. Each first period is time required for the first comparison voltage to change from the first reference voltage to the same voltage as the first signal voltage. Each second period is time required for the second comparison voltage to change from the second reference voltage to the same voltage as the second signal voltage.

17 Claims, 10 Drawing Sheets

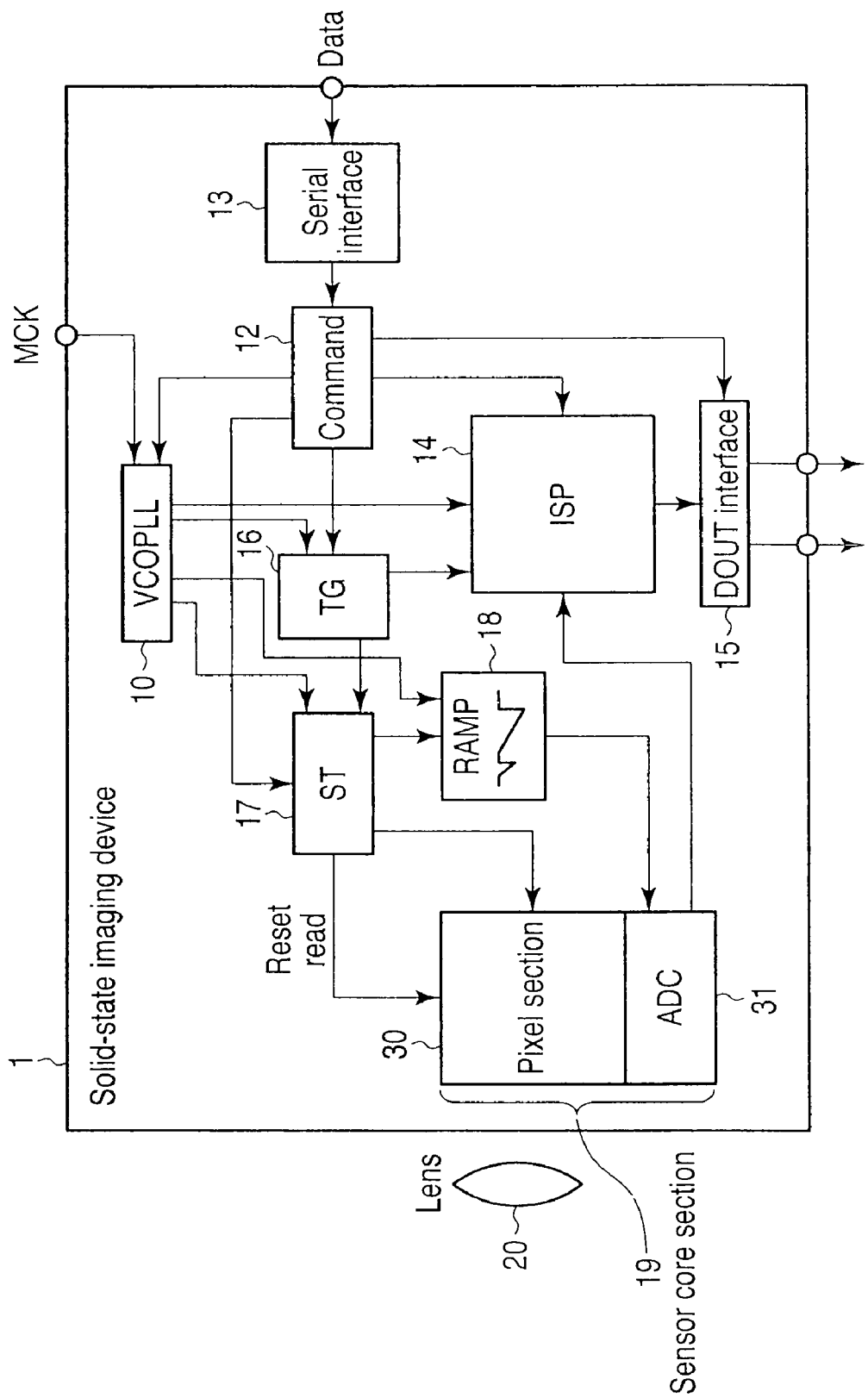
F I G. 1

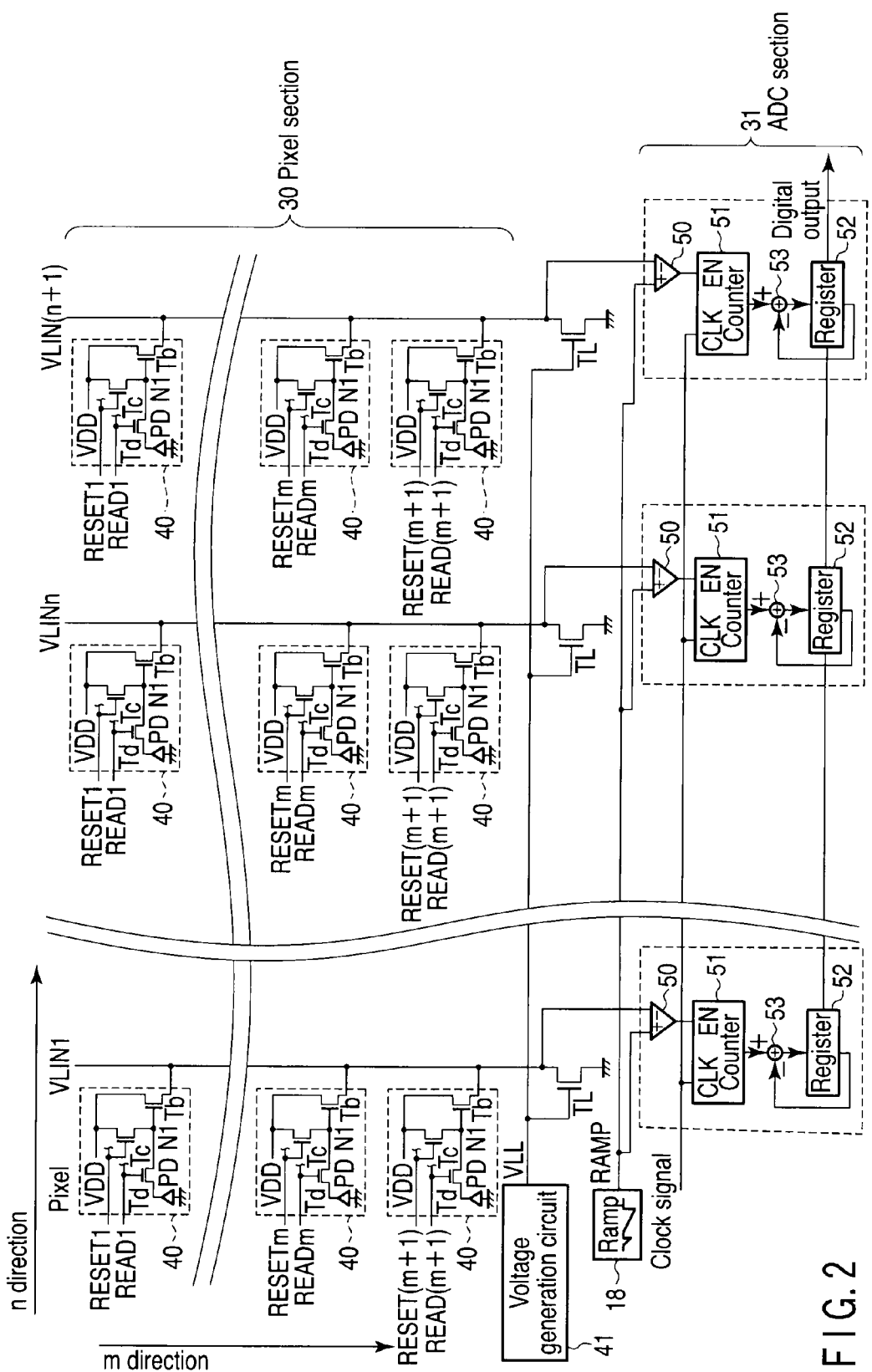
F I G. 2

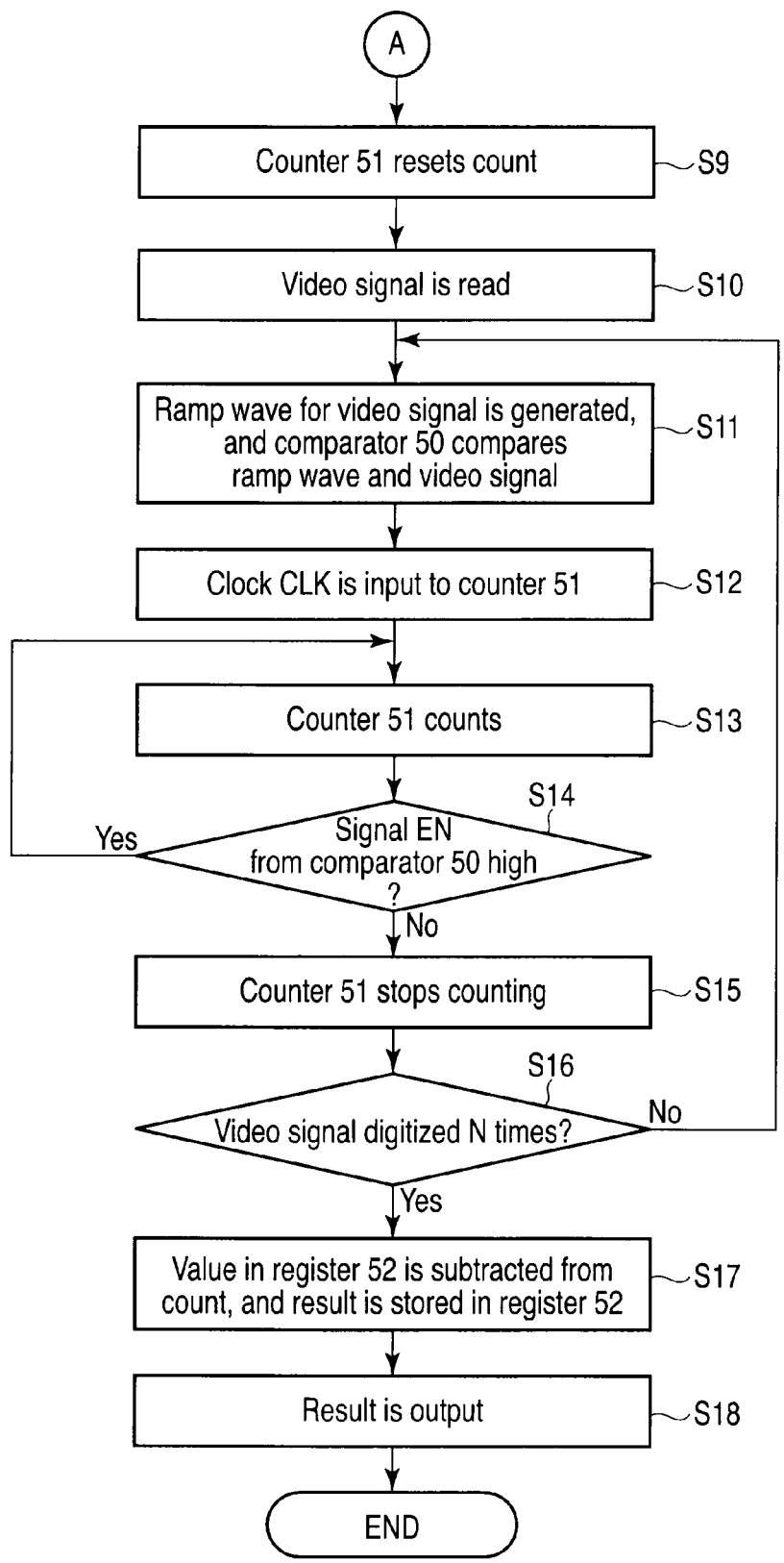
F I G. 3B

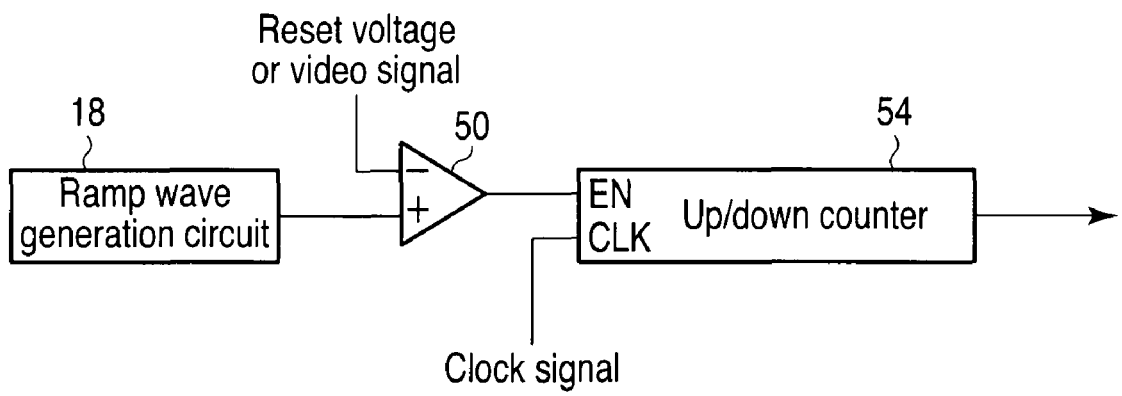
F I G. 6

ANALOG-TO-DIGITAL CONVERTER, SOLID-STATE IMAGING DEVICE INCLUDING THE SAME, AND METHOD OF DIGITIZING ANALOG SIGNAL

CROSS-REFERENCE TO RELATED APPLICATIONS

This application is based upon and claims the benefit of priority from prior Japanese Patent Application No. 2008-275566, filed Oct. 27, 2008, the entire contents of which are incorporated herein by reference.

BACKGROUND OF THE INVENTION

1. Field of the Invention

The present invention relates to an analog-to-digital converter, a solid-state imaging device including the same, and a method of digitizing analog signal.

2. Description of the Related Art

A means known so far as a system which digitizes a pixel signal in a CMOS image sensor continues counting until a voltage which is generated by a reference voltage generation circuit and changes in the shape of a slope with time reaches a voltage output from a pixel section to digitize a video signal output from the pixel section. Specifically, a difference between the voltage of the video signal output from the pixel section and the reset voltage which is a reference for this video signal is digitized. However, this technique generates thermal noise upon sampling of the potential difference.

Then, the following technique is known in consideration of the above-mentioned problem. First, after digitization of the reset voltage using the voltage output from the reference voltage generation circuit, the video signal is digitized using the voltage output also from the reference voltage generation circuit. Then, the difference between the two digitization results is adopted as the final digitization quantity, i.e., a digital quantity (see W. Yanget et al. and "An Integrated 800×600 CMOS Imaging System" ISSCC Digest of Technical Papers and February, 1999, pp. 304-305). However, since the difference between the digitization results of two times is adopted as the digital quantity, the above-mentioned technique has a fault that the thermal noise generated in the pixel section, the reference voltage generation circuit, and a comparator which are included in a solid-state imaging device is added twice.

BRIEF SUMMARY OF THE INVENTION

According to an aspect of the present invention, there is provided an analog-to-digital converter which receives a first analog signal voltage and a second analog signal voltage, receives a first comparison voltage which decreases by a fixed inclination with time from a first reference voltage larger than the first analog signal voltage to a voltage smaller than the first analog signal voltage, receives a second comparison voltage which decreases by the same inclination as the first comparison voltage with time from a second reference voltage larger than the second analog signal voltage to a voltage smaller than the second analog signal voltage, counts cumulatively over first periods to acquire a first result, wherein each of the first periods is time required for the first comparison voltage to change from the first reference voltage to the same voltage as the first analog signal voltage, counts cumulatively over second periods to acquire a second result, wherein each of the second periods is time required for the second comparison voltage to change from the second reference voltage to the same voltage as the second analog signal voltage, and outputs a difference between the first result and the second result as a digital quantity.

According to another aspect of the present invention, there is provided a solid-state imaging device comprising:

an analog-to-digital converter of claim 1;

a pixel section which generates a reset signal as the first analog signal voltage, and generates a video signal as the second analog signal voltage;

a voltage generation circuit which generates the first comparison voltage and the second comparison voltage; and a controller which instructs the voltage generation circuit to generate the first comparison voltage and the second comparison voltage for each of the reset signal and the video signal multiple times.

According to an aspect of the present invention, there is provided a method of digitizing an analog signal comprising:

reading out a first analog signal;

comparing the first analog signal with a first comparison voltage which decreases by a fixed inclination with time from a first reference voltage larger than a voltage of the first analog signal to a voltage smaller than the voltage of the first analog signal;

counting cumulatively over first periods to acquire a first result, each of the first periods being time required for the first comparison voltage to change from the first reference voltage to the same voltage as the first analog signal;

reading out a second analog signal;

comparing the second analog signal with a second comparison voltage which decreases by the same inclination as the first comparison voltage with time from a second reference voltage larger than a voltage of the second analog signal to a voltage smaller than the voltage of the second analog signal;

counting cumulatively over second periods to acquire a second result, each of the second periods being time required for the second comparison voltage to change from the second reference voltage to the same voltage as the second analog signal; and outputting a difference between the first result and the second result as a digital quantity.

BRIEF DESCRIPTION OF THE SEVERAL VIEWS OF THE DRAWING

FIG. 1 is a block diagram of an illustrative configuration of the solid-state imaging device (CMOS image sensor) according to the first embodiment of the present invention.

FIG. 2 is a circuit diagram of the sensor core section according to the first embodiment of the present invention.

FIGS. 3A and 3B are a flowchart showing the operation of the ADC section according to the first embodiment of the present invention.

FIG. 6 is a circuit diagram of the ADC section according to the second embodiment of the present invention.

DETAILED DESCRIPTION OF THE INVENTION

Figure 3A:
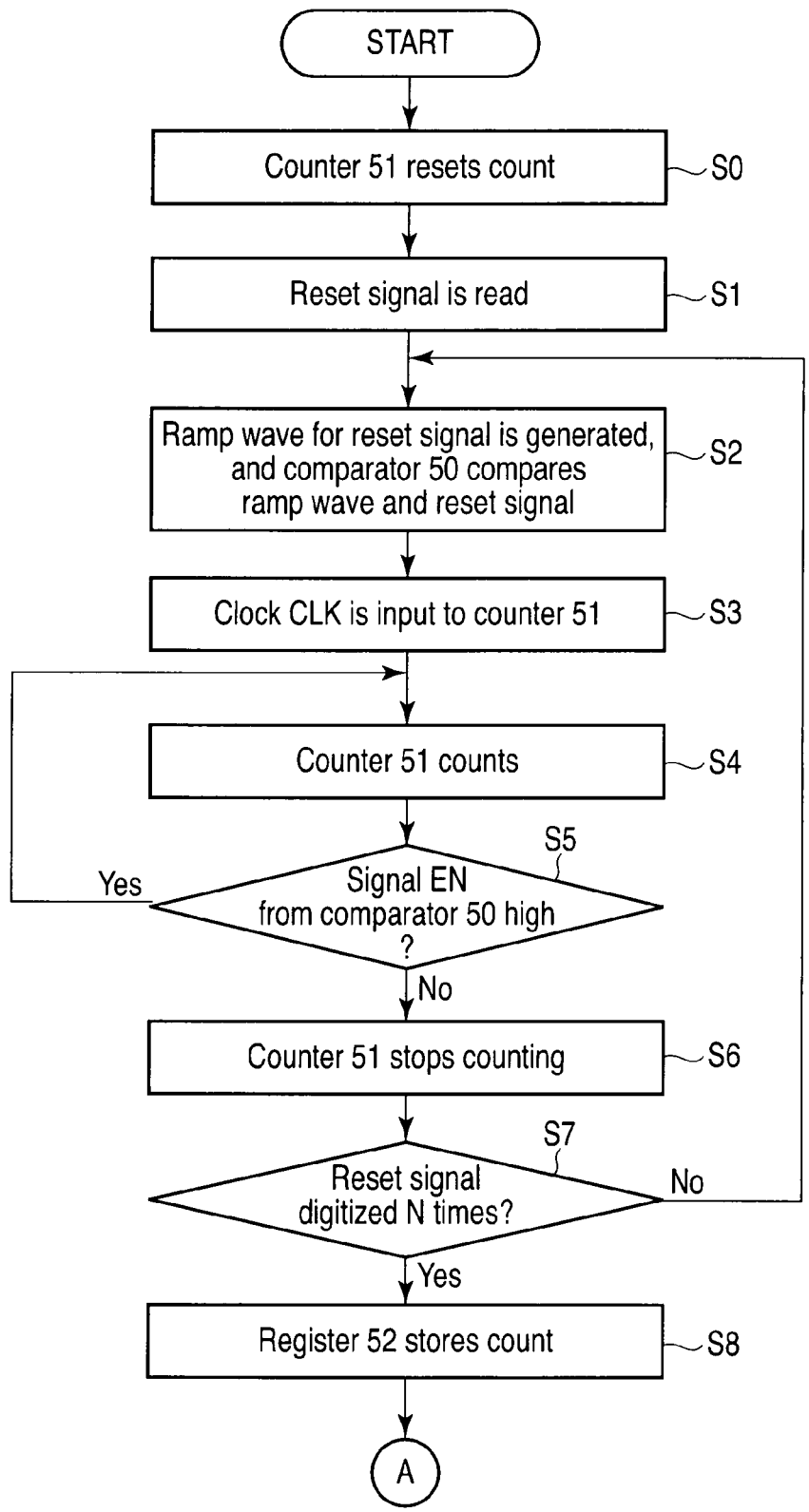

Embodiments of the present invention will now be described with reference to drawings. In the following description, the same components are indicated with the same reference numbers throughout the figures.

First Embodiment

The analog-to-digital converter and solid-state imaging device including the same according to the first embodiment of the present invention will be described with reference to FIG. 1.

FIG. 1 illustrates configuration of the solid-state imaging device according to the first embodiment of the present invention. Description will be given using a CMOS image sensor as an example. As shown in FIG. 1, the solid-state imaging device 1 includes a clock control circuit 10 (VCOPLL 10), serial command input/output section 12, serial interface 13, video signal processing circuit 14 (ISP 14), data output interface 15 (DOUT 15), reference timing generation circuit 16 (TG 16), sensor driving timing generation circuit 17 (ST 17), ramp wave generation circuit 18, sensor core section 19, and lens 20. The sensor core section 19 includes an analog-to-digital conversion circuit 31 (ADC section 31) established in the side part of the pixel section 30 and the pixel section 30. The details of each part will now be described.

The VCOPLL 10 generates an internal clock (hereinafter referred to as the clock signal CLK) of the solid-state imaging device 1 based on the master clock MCK. The master clock MCK is, for example, the clock signal CLK acquired with a clock (hereinafter referred to as an external clock) provided outside the solid-state imaging device 1 and used as a reference. The frequency of the internal clock is controlled by the VCOPLL 10.

The serial interface 13 receives control data DATA for operating the overall system of the solid-state imaging device 1 including the ISP 14 from the outside. Control data DATA includes, for example, commands and operation timings for operating the whole system. The serial interface 13 outputs control data received from the outside to the serial command input/output section 12.

The serial command input/output section 12 outputs control data received from the serial interface 13 to the VCOPLL 10, TG 16, ISP 14, and DOUT 15.

The TG 16 outputs instructions to the ST 17 and ISP 14, and controls the operation of the sensor core section 19 and ISP 14 in accordance with control data DATA from the serial command input/output section 12. That is, the TG 16 outputs operation timing instructions to the ISP 14 which drives video signal processing, and the ST 17 which controls operation timing of the sensor core section 19. Namely, after accumulation of electric charge received by the sensor core section 19, the TG 16 outputs to the ST 17 instructions regarding the timings for reading of this electric charge, for digitization of the read video signal, and for transmission of this video signal to the ISP 14, etc. Further, the TG 16 outputs to the ISP 14 the timings for transmission of the video signal from the sensor core section 19, and for outputting the video signal to the DOUT 15, etc.

The ST 17, based on the operation timings output from the TG 16, outputs a detection-section reset pulse (signal RESET), and a signal read pulse (signal READ) to the sensor core section 19. RESET and READ are digital signals. The ST 17 outputs instructions regarding the operation timings and the number of times for generating the ramp wave to the ramp wave generation circuit 18.

The ramp wave generation circuit 18, in accordance with the operation timing output from the ST 17, generates the ramp wave and outputs it to the ADC section 31. Specifically, the ramp wave generation circuit 18 outputs the ramp wave several times for each of the video signal read from the sensor core section 19 and the reset voltage (described later).

The sensor core section 19 includes pixels arranged in a matrix. In the pixel section 30, reset is performed on pixels and the video signals are read from the pixels in accordance with signals RESET and READ, which are output from the ST 17. The reset triggers the pixel section 30 to output a reset level to the ADC section 31. The reset level will be described later.

The ADC section 31, in accordance with the level of the ramp wave output from the ramp wave generation circuit 18, digitizes each of the analog reset voltage and video signal output from the pixel section 30, and then outputs a difference between these digital signals. The ADC section 31 converts the analog reset voltage and video signal into digital quantities of, for example, 1024 levels. As a result, the ADC section 31 obtains a 10-bit digital signal of the video signal. Then, the obtained digital signal is read from the ADC section 31.

The ISP 14 performs video signal processing on the digital video signal from the sensor core section 19 in accordance with the timing output from the TG 16. The video signal processing includes white balancing, broad dynamic range processing, noise reduction, defective pixel compensation, etc. The ISP 14 then outputs the digital signal on which video signal processing has been performed to the DOUT 15.

The DOUT 15 outputs the digital signal on which video signal processing has been carried out to the outside of the solid-state imaging device 1.

The lens 20 collects external light, which passes through a color separation filter that separates the light into red, green and blue components, these being presented to the pixel section 30.

<Details of Sensor Core Section 19>

The sensor core section 19 will now be described in detail with reference to FIG. 2. FIG. 2 is a circuit diagram of the sensor core section 19.

<Pixel Section 30>

As shown, the pixel section 30 includes pixels 40 arranged in a matrix. The pixels 40 are connected to one of the perpendicular signal lines VLIN. In a perpendicular direction, the (m+1) pixels 40 are provided. Each perpendicular signal line VLIN is connected to a MOS transistor TL and the ADC section 31 provided for its own. In the following, the perpendicular signal line VLIN1 and the pixels 40 arranged on the first horizontal line which intersects perpendicularly with the perpendicular signal line VLIN will be described.

Each pixel 40 includes MOS transistors Tb, Tc, Td, and a photodiode PD. The MOS transistor Tc receives signal RESET1 from the ST 17 at its gate, receives voltage VDD (for example, 2.8 V) at its drain, and is connected to the connection node N1 at its source. That is, the MOS transistor Tc functions as a reset transistor which generates the reset voltage used as a reference voltage of the video signal read from the photodiode PD. The MOS transistor Td receives signal READ1 from the ST 17 at its gate, is connected to the connection node N1 at its drain and to the cathode of the photodiode PD at its source. That is, the MOS transistor Td functions as a signal-electric-charge read transistor. The anode of the photodiode PD is grounded.

The MOS transistor Tb is connected to the connection node N1 at its gate, and receives voltage VDD at its drain, and is connected to the perpendicular signal line VLIN1 at its source. As a result, the gate of the MOS transistor Tb, the source of the MOS transistor Tc, and the drain of the MOS transistor Td are connected at the connection node N1. The connection node N1 is a node for detecting potential. The MOS transistor Tb serves to amplify the video signal.

A signal line which transmits signals RESET1 and READ1 is respectively connected to the pixels 40 arranged on the first horizontal line. That is, a signal line is the first horizontal line, and is connected to the pixels 40 which are connected to one of the perpendicular signals line VLIN1 to VLIN (n+1). The same holds true for the second to (m+1)th horizontal lines which intersect perpendicularly with the perpendicular signal line VLIN.

The pixels 40 arranged on the same column are connected to one of perpendicular signal lines VLIN1 to VLIN(n+1) via the source of the MOS transistor Tb. In the following description, when perpendicular signal lines VLIN1 to VLIN(n+1) are not distinguished, each of them is only referred to as a perpendicular signal line VLIN, where n is a natural number.

The pixels 40 in the same row receive the same one of signals RESET1 to RESET(m+1), and the same one of signals READ1 to READ(m+1), where m is a natural number. In the following description, when signals RESET1 to RESET (m+1) and signals READ1 to READ(m+1) are not distinguished, they are referred to simply as signals RESET and READ, respectively.

The MOS transistor TL is connected to one end of the perpendicular signal line VLIN at its drain, receives at its gate voltage VLL generated by the voltage generation circuit 41, and is grounded at its source. Voltage VLL output from the voltage generation circuit 41 is applied to the gate of each of all MOS transistors TL each for the perpendicular signal lines VLIN1 to VLIN(n+1). MOS transistors TL and Tb constitute a source follower circuit.

<Configuration of ADC Section 31>

Configuration of the ADC section 31 will now be described in detail. The ADC section 31 includes a set of a comparator 50, counter 51, computing element 53, and a register 52 for each perpendicular signal line VLIN. The inverting input of the comparator 50 is connected to the drain of the MOS transistor TL, and the non-inverting input thereof is connected to the output of the ramp wave generation circuit 18. That is, the drain of each MOS transistor TL in the same column and one end of the perpendicular signal line VLIN are connected to the non-inverting input of the comparator 50. The comparator 50 compares the signals input to the inverting input and the non-inverting input, and outputs the comparison result to the counter 51.

The counter 51 receives the comparison result from the comparator 50, and the clock signal CLK. The clock signal CLK may be output from the ST 17, or output directly from the VCOPLL 10. The counter 51 counts in accordance with the signal from the comparator 50 and the clock signal CLK. Specifically, the counter 51 counts in accordance with the clock signal CLK when the output of the comparator 50 is high, and stops counting when the output is low. The counter 51 uses the count to measure the time required for the ramp wave to fall from the initial value to the potential of the perpendicular signal line. Then, the counter 51 outputs the count to the computing element 53, and then resets the count up to that time if needed. In cases where 1-bit analog-to-digital conversion is performed in the ADC section 31, the counter 51 counts up to at least 2l (1 being a natural number). For example, when l=10 bits, the counter 51 counts up to at least 1024.

The computing element 53 outputs the count output from the counter 51 to the register 52. Further, the computing element 53 subtracts the count held in the register 52 beforehand from the count output from the counter 51.

The register 52 receives the count output from the computing element 53. Then, the register 52 holds the count, and outputs this count to the computing element 53. Then, the register 52 stores the count with the subtraction performed by the computing element 53. Then, the digital quantity stored in the register 52 passes through the ISP 14 and is output by the operation of this register 52. Note that the digital signal transmitted to the ISP 14 from the register 52 includes the video signals from the pixels 40 arranged on one horizontal line which intersects perpendicularly with perpendicular signal lines VLIN1 to VLIN(n+1). That is, the registers 52 collectively transmit to the ISP 14 the video signals read from the n+1 pixels 40 arranged on one horizontal line.

<Operation of ADC Section 31>

Digitization of the analog reset voltage and video signal in the solid-state imaging device according to the first embodiment will now be described with reference to FIGS. 3A and 3B. FIGS. 3A and 3B are a flowchart showing the flow of digitization of the analog reset signal and video signal by the solid-state imaging device.

First, the ST 17 instructs the counter 51 to reset the count. As a result, the counter 51 sets the count to zero (FIG. 3A, Step S0). Then, the reset signal is read from the pixel section 30, and the read reset signal is input to the inverting input of the comparator 50 (S1). The ramp wave generation circuit 18 generates the ramp wave for the reset signal to be output to the comparator 50. The comparator 50 compares the ramp wave for the reset signal and the reset signal (S2). The clock signal CLK is output to the counter 51 from, for example, the ST 17 (S3). The counter 51 counts in synchronization with the clock signal CLK (S4). Specifically, when signal EN output from the comparator 50 is high (S5, YES), the counter 51 counts up in synchronization with the clock signal CLK (S4). Conversely, when signal EN is low, the counter 51 stops digitization (analog-to-digital conversion) (S6). Accordingly, the counter 51 stops the count-up. The ST 17 determines whether the reset signal has been digitized N times (S7), where N is a natural number.

If it is determined in step S7 that the reset signal has not been digitized N times (S7, NO), the processing returns to step S2 and repeats the above-mentioned steps. Conversely, if it is determined in step S7 that the reset signal has been digitized N times (S7, YES), the ST 17 instructs the register 52 to hold the count up to that time held in the counter 51 (S8). Then, the ST 17 instructs the counter 51 to reset the count held thereby to set the counter 51 to zero (FIG. 3B, S9).

Then, the video signal is read from the pixel section 30. The read video signal is input to the inverting input of the comparator 50 (S10). The ramp wave generation circuit 18 generates the ramp wave for the video signal to be output to the comparator 50. The comparator 50 compares the ramp wave for the video signal and the video signal (S11). The clock signal CLK is output to the counter 51 from, for example, the ST 17 (S12). The counter 51 counts in synchronization with the clock signal CLK (S13). Specifically, when signal EN output from the comparator 50 is high (S14, YES), the counter 51 counts up in synchronization with the clock signal CLK (S13). Conversely, when signal EN is low, the counter 51 stops the digitization (S15). Accordingly, the counter 51 stops the count-up. The ST 17 determines whether the video signal has been digitized N times (S16). If it is determined in step S16 that the reset signal has not been digitized N times (S16, NO), the processing returns to step S11 and repeats above-mentioned steps. Conversely, if it is determined in step S16 that the video signal has been digitized N times, or the number of times of digitization of the video signal and that of the reset signal is the same (S16, YES), the computing element 53 subtracts the value up to that time held in the register 52 from the counter 51 (S17). The register 52 temporarily holds this subtraction result, and outputs it (S18).

<Operation of Solid-State Imaging Device According to First Embodiment>

Figure 4:
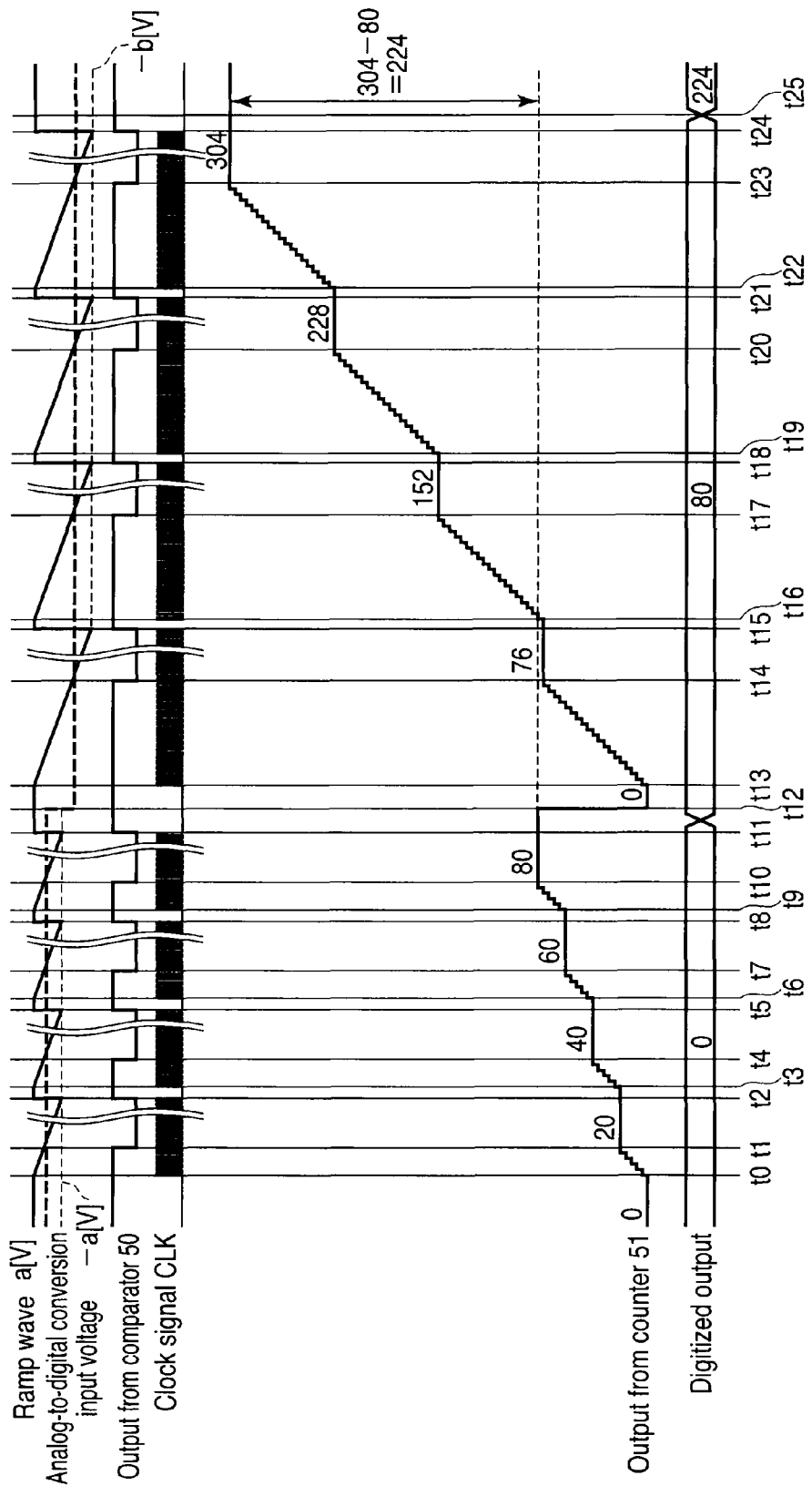
FIG. 4 is a timing chart showing operation of the solid-state imaging device according to the first embodiment of the present invention.

Operation by the solid-state imaging device including the ADC section 31 will now be described with reference to FIG. 4. FIG. 4 is a timing chart showing digitization of the analog reset voltage and the voltage of the video signal (hereinafter referred to as the video signal voltage) which are output to the ADC section 31 from the pixel section 30. The vertical axis represents the output of the ramp wave generation circuit 18, reset voltage and video signal voltage (in the figure, indicated as an analog-to-digital conversion input voltage) which are output from the pixel section 30, clock signal CLK of the VCOPLL 10, output from the counter 51, and digitized video signal held in the register 52. The horizontal axis represents time. The ADC section 31 converts the difference between the video signal voltage and reset voltage which are output from the pixel section 30 into 12-bit digital data. Suppose that 10-bit analog-to-digital conversion is performed on the reset voltage or video signal voltage for every output of the ramp wave, output of four times of the ramp wave to each of the reset voltage and video signal voltage will realize 12-bit analog-to-digital conversion. The ramp wave generation circuit 18 is controlled by the ST 17. The ramp wave varies from and to larger and smaller values than the amplitude of the reset voltage and video signal voltage. Specifically, the ramp wave for reset voltage has an amplitude of −a to a [V] with the reset voltage as the basis, and the ramp wave for the video signal voltage has an amplitude of −b to −a[V] with the reset voltage as the basis, b being larger than a.

The inclination of the RAMP and the frequency of the clock signal CLK are always constant for the reset voltage detection and video signal voltage detection. First, at time t0, the reset voltage is read from the pixel section 30, and the ramp wave generation circuit 18 generates the ramp wave. Then, the ADC section 31 digitizes the reset voltage. Specifically, processing from steps S0 to S8 described with reference to FIG. 3A is performed. Then, with reception of the reset command by the counter 51 from the ST 17 at time t0, the counter 51 is reset to zero. The voltage of the output of the ramp wave generation circuit 18 has amplitude a[V] larger than the reset voltage. For this reason, the comparator 50 compares the ramp wave input to the non-inverting input thereof with the reset voltage input to the inverting input thereof to output a high signal EN to the counter 51. Therefore, the counter 51 counts up in synchronization with the clock signal CLK. Then, the potential of the ramp wave decreases in the shape of a slope from time t0, and becomes the same as the reset voltage at time t1. When the ramp wave becomes smaller than reset voltage, the comparator 50 outputs a low signal EN to the counter 51. As a result, the counter 51 stops the count. It is assumed that the counter 51 at the time of stopping has a count of 20. At time t2, the ramp wave generation circuit 18 finishes the first sweep, and the voltage of the ramp wave becomes −a[V]. In addition, the clock signal CLK to the counter 51 stops at time t2. Here, the digitization of the reset voltage is completed.

Also at time t2, the voltage output from the ramp wave generation circuit 18 is changed to a[V] from −a[V] under control of the ST 17. The ramp wave generation circuit 18 outputs fixed voltage a[V] from time t2 to time t3 under control of the ST 17.

Then, the operation from time t0 to time t3 (digitization of the analog reset voltage in the period from time t0 to time t1) is repeated several times (for example, 3 times). That is, the ramp wave generation circuit 18 outputs the ramp wave for the reset voltage three times under control of the ST 17 from time t3 to time t11, as in the operation between times t0 and t3. That is, the ramp wave generation circuit 18 carries out the sweep of the ramp wave three times under control of the ST 17. The counter 51 continues the count in accordance with the clock signal CLK during each period until the ramp wave is the same as the reset voltage. The counter 51 accumulates the count up to that time without resetting it. Specifically, the counter 51 counts by 20 during each period of times t0 to t1, t3 to t4, t6 to t7, and t9 to t10 for which the output of the comparator 50 remains high. As a result, the counter 51 has a count of 80 at time t10. Note that the ST 17 issues a command to reset the counter 51 on the first digitization of the reset voltage, but does not issue it on the following digitization of the reset voltage.

At time t11, the voltage output from the ramp wave generation circuit 18 is changed to a[V] from −a[V] under control of the ST 17. Then, the ramp wave generation circuit 18 outputs fixed voltage a[V] from time t11 to time t13 under control of the ST 17.

At time t12, the video signal read from the pixel section 30 under control of the ST 17 is output to the inverting input of the comparator 50. Then, the ST 17 instructs the register 52 to output the count of 80 accumulated by the counter 51 up to that time. As a result, the ADC section 31 starts digitization of the video signal. Specifically, processing from steps S9 to S16 described with reference to FIG. 3B is performed. In addition, the counter 51 outputs the count accumulated up to that time to the register 52, and then resets the count.

At time t13, the ramp wave generation circuit 18 outputs the voltage which has amplitude a[V] larger than the video signal. For this reason, the comparator 50 compares the ramp wave input to the non-inverting input thereof with the video signal input to the inverting input thereof to output a high signal EN to the counter 51. Therefore, the counter 51 counts up from zero again in accordance with the clock signal CLK. Then, the potential of the ramp wave starts decreasing from time t13 under control of the ST 17, and becomes the same as the potential of the video signal at time t14. When the ramp wave becomes smaller than the reset voltage, the comparator 50 makes signal EN output to the counter 51 low. As a result, the counter 51 stops the count. The counter 51 has a count of 76 at the time of stopping. At time t15, the ramp wave generation circuit 18 finishes the sweep, and the voltage of the ramp wave becomes −b[V]. In addition, at time t15, the clock signal CLK to the counter 51 stops.

Also at time t15, the voltage output from the ramp wave generation circuit 18 is changed to a from −b[V] under control of the ST 17. The ramp wave generation circuit 18 outputs fixed voltage a[V] from time t16 to time t17 under control of the ST 17.

Then, the operation from time t13 to time t16 (digitization of the analog video signal voltage in the period from time t13 to time t14) is repeated several times (for example, three times). That is, the ramp wave generation circuit 18 outputs the ramp wave for the video signal three times from time t16 to time t24 as in the operation from time t13 to time t16. The counter 51 continues the count in accordance with the clock signal CLK during each period in which the ramp wave is larger than the video signal voltage. That is, the counter 51 accumulates the count up to that time without resetting it. Specifically, the counter 51 counts by 76 during each period of times t13 to t14, t16 to t17, t19 to t20, and t22 to t23 for which the output of the comparator 50 remains high. As a result, the counter 51 outputs the accumulated count of 304 to the computing element 53. Note that ST 17 issues a command to reset the counter 51 on the first digitization of the video signal, but does not issue it on the following digitization of the video signal.

At time t25, the computing element 53 subtracts the digital quantity of 80 of the reset voltage held in the register 52 from the count of 304 output from the counter 51, and stores the subtraction result of 224 in the register 52. The register 52 outputs the subtraction result of 224 as the digital quantity of the video signal. Note that the digitization of the reset voltage and video signal voltage using the ramp wave is referred to as a digital double sampling, and execution of four digitizations as in the first embodiment is referred to as quadruplex digital double sampling.

<Advantage According to First Embodiment>

The analog-to-digital converter and solid-state imaging device including the same according to the first embodiment can realize the following advantages.

(1) Noise Characteristics can be Improved.

The advantage according to the first embodiment will be described with reference to a comparative example. As a comparative example, the case where the ramp wave generation circuit 18 would output the ramp wave once for each of the reset signal and video signal in FIG. 4 will be described. That is, operation of the ADC section 31 according to the comparative example does not have the operation from time t3 to time t11 and from time t16 to time t24 in FIG. 4. Also in this case, the ramp wave generation circuit 18 is controlled by the ST 17. In other words, digital double sampling is used as a comparative example.

When components in a solid-state imaging device operate, various forms of noise are generated. Among such noise, that included in the reset voltage and video signal in the solid-state imaging device, and that generated in the ramp wave generation circuit 18 and in the comparator 50 may be particularly pronounced. Standard deviation as a result of the digitization of the signal which includes such thermal noise is assumed to be $\sigma$ [LSB]. Specifically, the counter 51 counts in accordance with an output from the comparator 50, and even if the count should be 10, the variation represented by $\sigma$ may change the count from 10.

Since the ADC section 31 according to the comparative example digitizes the reset voltage and video signal once, respectively (or, a total of two times) to calculate a difference between the two results, a component of thermal noise included in the final digitization result is $2^{1/2} \times \sigma$. This is proportional to the square root of the number of times of digitization because noise components are not correlated. Then, assume that 10-bit analog-to-digital conversion is performed on the reset voltage and video signal voltage for every output of the ramp wave as described above, the digitized difference between the final video signal voltage and reset voltage is a 10-bit digital quantity, which is a quantity having 1024 levels. The signal has a signal-to-noise ratio of $1024/2^{1/2} \times \sigma$.

In contrast, the analog-to-digital converter and solid-state imaging device including the same according to the first embodiment can reduce the above-mentioned thermal noise and improve the signal-to-noise ratio. This will be described in detail. As mentioned above, in the first embodiment, the ramp wave generation circuit 18 outputs the same ramp waves four times for each of the reset voltage and video signal voltage. That is, digitization is performed eight times in total. Therefore, the digitized thermal noise generated is $8^{1/2} \times \sigma$. Assume that 10-bit analog-to-digital conversion is performed for every output of the ramp wave, the final digitization result is a 12-bit digital quantity, which is a quantity having 4096 levels. The components of the thermal noise included in the final digitization result converted to 10 bits are $1024/4096 \times 8^{1/2} \times \sigma = 2^{1/2} \times \sigma/2$. It is appreciated that the thermal noise is half the comparative example. That is, $\sigma$ can be reduced to a half. In other words, the execution of the quadruplex digital double sampling by the ADC section 31 can reduce the influence of thermal noise. Accordingly, the variation in the count obtained by the counter 51 can be suppressed.

In addition, the signal-to-noise ratio is $4096/8^{1/2} \times \sigma = 2048/2^{1/2} \times \sigma$, and is twice the comparative example.

<Modification>

<Operation of Modified Solid-State Imaging Device According to First Embodiment>

Figure 5:
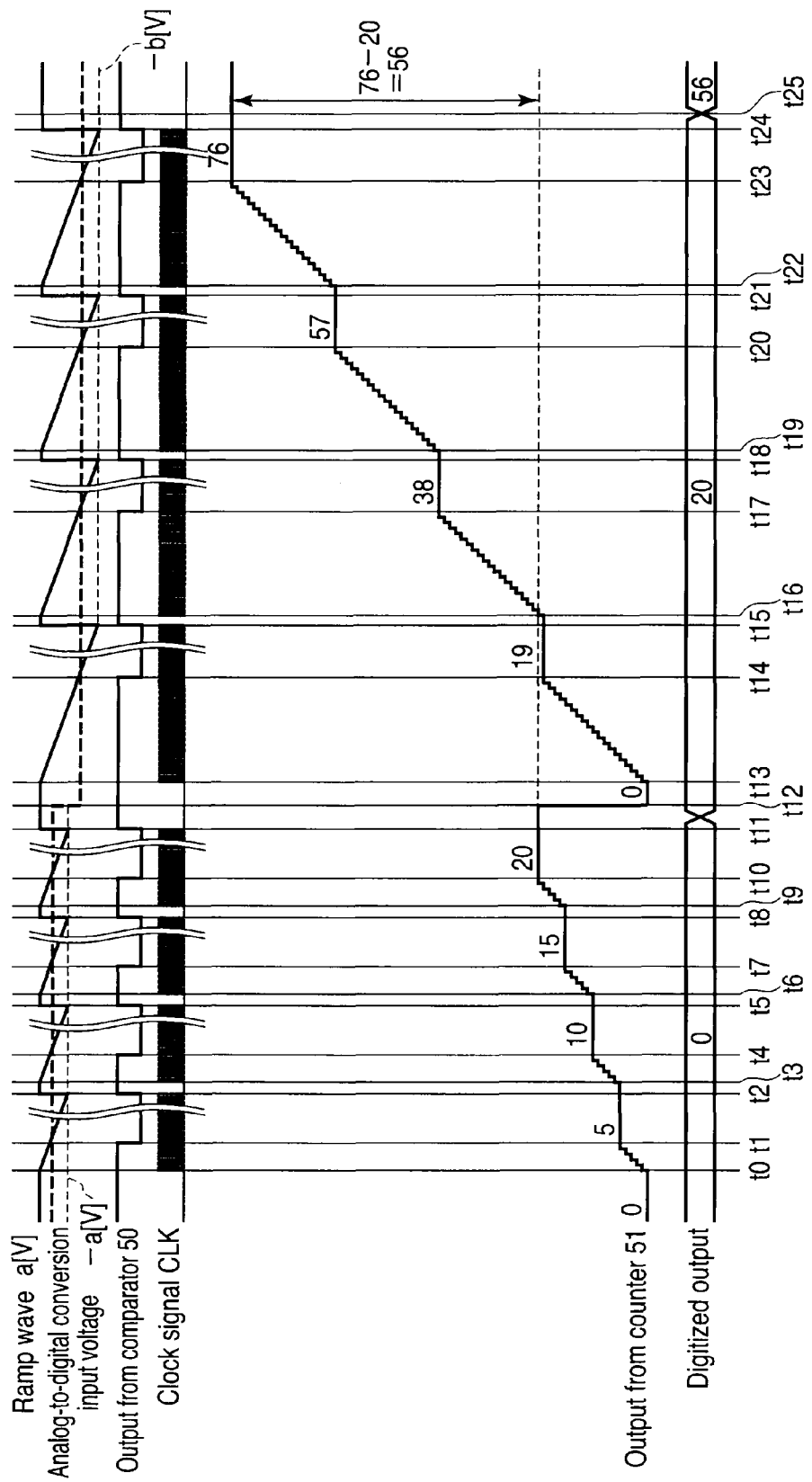
FIG. 5 is a timing chart showing operation of the solid-state imaging device according to a modified first embodiment of the present invention.

Operation of solid-state imaging device including a modified ADC section 31 will now be described with reference to FIG. 5. FIG. 5 shows quadruplex digital double sampling as in FIG. 4, and it is a timing chart which shows digitization of the reset voltage and the video signal output to the ADC section 31 from the pixel section 30. The vertical axis represents the output of the ramp wave generation circuit 18, reset voltage and video signal (shown in the figure as an analog-to-digital conversion input voltage) which are output from the pixel section 30, clock signal CLK of the VCOPLL 10, output from the counter 51, and digitized video signal held in the register 52. The horizontal axis represents time. Only operations different from those of the solid-state imaging device described with reference to FIG. 4 will be described.

The ADC section 31 according to the modified first embodiment repeats digitization k times to the reset voltage and video signal voltage to convert a difference between the two signals into an 1-bit digital quantity. The counter 51, for every output of the ramp wave, counts to m (m being a natural number) for the reset voltage, and counts to m+2^l/k for the video signal voltage (k being a natural number). By outputting the ramp wave for each of the reset voltage and video signal voltage which are output from the pixel section 30, for example, four times, for conversion of those to 10-bit digital data, the reset voltage is converted into a digital quantity m for one ramp wave output, and the video signal voltage is converted into a digital quantity m+256.

Specifically, the first digitization of the reset voltage is performed from time t0 to time t3. As a result, the counter 51 counts to 5 until time t1 when signal EN output from the comparator 50 is made low. That is, since the ADC section 31 according to the modified first embodiment obtains a 256-level digital signal by one digitization, the counter 51 takes one fourth a level of the ADC section 31 according to the first embodiment. Here, the digitization of the reset voltage is completed.

Then, the operation from time t0 to time t3 (digitization of the analog reset voltage in the period from time t0 to time t1) is repeated several times (for example, three times). That is, the ramp wave generation circuit 18 outputs the ramp wave of the shape of a slope for the reset voltage three times and repeats digitization of the reset voltage three times from time t3 to time t11 as the operation from time t0 to time t3. That is, the counter 51 keeps counting in accordance with the clock signal CLK during each period in which the ramp wave is larger than the reset voltage. Then, the counter 51 accumulates the count up to that time without resetting it. Specifically, the counter 51 counts by 5 during each period of times t0 to t1, t3 to t4, t6 to t7, and t9 to t10 for which the output of the comparator 51 remains high. Then, when the video signal is read from the pixel section 30, the counter 51 outputs the accumulated count of 20 to the register 52. Operation of the solid-state imaging device according to the modified first embodiment other than that described above are the same as that of the solid-state imaging device shown in FIG. 4.

The same holds true for the video signal voltage. That is, the first digitization of the video signal is performed from time t13 to time t16. As a result, the counter 51 counts up to 19 until time t14 when signal EN output from the comparator 50 is made low. That is, since the ADC section 31 according to the modified first embodiment obtains a 256-level digital signal by one digitization as described above, the counter 51 takes one fourth a level of the ADC section 31 according to the first embodiment. Here, the digitization of the video signal voltage is completed. Then, the ramp wave generation circuit 18 outputs the ramp wave for video signal voltage three times under control of the ST 17 from time t16 to time t24 as the operation from time t13 to time t16 described above. Then, the counter 51 keeps counting up in accordance with the clock signal CLK during each period in which the ramp wave is larger than the video signal voltage. That is, the counter 51 accumulates the count up to that time without resetting it. Specifically, the counter 51 counts by 19 during each period of times t13 to t14, t16 to t17, t19 to t20, and t22 to t23 for which the output of the comparator 51 remains high. Then, the counter 51 outputs the accumulated count of 76 to the register 52.

At time t25, the register 52 uses the subtracter to subtract the held digital quantity of 20 of the reset voltage from the count of 76 output from the counter 51 to obtain digital quantity of 56 of the video signal.

<Advantage According to Modified First Embodiment>

The analog-to-digital converter and solid-state imaging device including the same according to the modified first embodiment can realize not only advantage 1, above, but the following advantage.

(2) Processing Speed can be Improved or Power Consumption can be Reduced.

Also in the analog-to-digital converter and solid-state imaging device including the same according to the modified first embodiment, the ramp wave generation circuit 18 outputs the same ramp wave four times for each of the reset voltage and video signal voltage. That is, a total of eight digitizations are performed. Further, counts of the clock signal CLK in the ADC section 31 according to the modified first embodiment are smaller than those of the first embodiment and the comparative example. Specifically, the counts by the counter 51 in one digitization are 5 and 19. Then, the counts obtained as a result of the four digitizations of each of the reset voltage and video signal are 20 and 76, respectively. Therefore, the magnitude of the thermal noise generated by one digitization is a fourth the first embodiment and the comparative example. That is, it is $\sigma/4$. Then, since the ADC section 31 performs eight digitizations in total, the thermal noise is $81/2\times\sigma/4$. That is, it is half the comparative example. The signal-to-noise ratio is $1024/(81/2\times\sigma/4)=2048/21/2\times\sigma$, and is twice the comparative example. However, this relation holds only in cases where the thermal noise is fully larger than quantizing noise.

Then, the ADC section 31 according to the modified first embodiment converts the reset voltage and video signal voltage read from the pixel section 30 to digital quantities of 256 levels per sampling. That is, the clock signal CLK input to the counter 51 is counted 256 times for every counting operation. Therefore, if the time required for one clock cycle is the same in the ADC sections 31 in both the modified and unmodified first embodiments, the ADC section 31 spends less time to digitize each of the reset signal and video signal voltage four times than the first embodiment. Thereby, advantage of increased processing speed can also be obtained.

Further, lengthening the time required for one clock cycle using the VCOPLL and multiplying this clock with the time required for digitization of the reset voltage and video signal voltage may reduce the power consumption of the solid-state imaging device.

Second Embodiment

The analog-to-digital converter and solid-state imaging device including the same according to the second embodiment of the present invention will now be described. Description will be given using a CMOS image sensor as an example. The second embodiment corresponds to the first embodiment with a modified ADC section 31 shown in FIG. 2 of the first embodiment. Only differences from the solid-state imaging device according to the first embodiment will be described with reference to FIG. 6. The same components are indicated with the same reference numbers.

FIG. 6 is a block diagram of the ADC section 31 according to the second embodiment. As shown, the ADC section 31 does not include the register 52 and subtraction section 53, but includes an up/down counter 54 instead of the counter 51. The comparison result of the comparator 50 is output to the up/down counter 54 as signal EN. Then, the up/down counter 54 outputs a digital quantity of a difference between the reset voltage and video signal voltage. In other words, the up/down counter 54 also functions as a computing element and a register.

As a different function from the counter 51 according to the first embodiment, the up/down counter 54 adopts either a down-count mode or an up-count mode, and either counts up or counts down when signal EN, representing a comparison result from the comparator 50, is high.

When, for example, the output of the comparator 50 on reading the reset voltage is high, the comparator 50 counts down. Alternatively, when the output from the comparator 50 on reading of the video signal voltage is high, the comparator 50 counts up. Because of this operation, the last value of the up/down counter 54 is equal to a digitized difference between the reset voltage and video signal voltage.

<Operation of ADC Section 31>

Figure 7A:
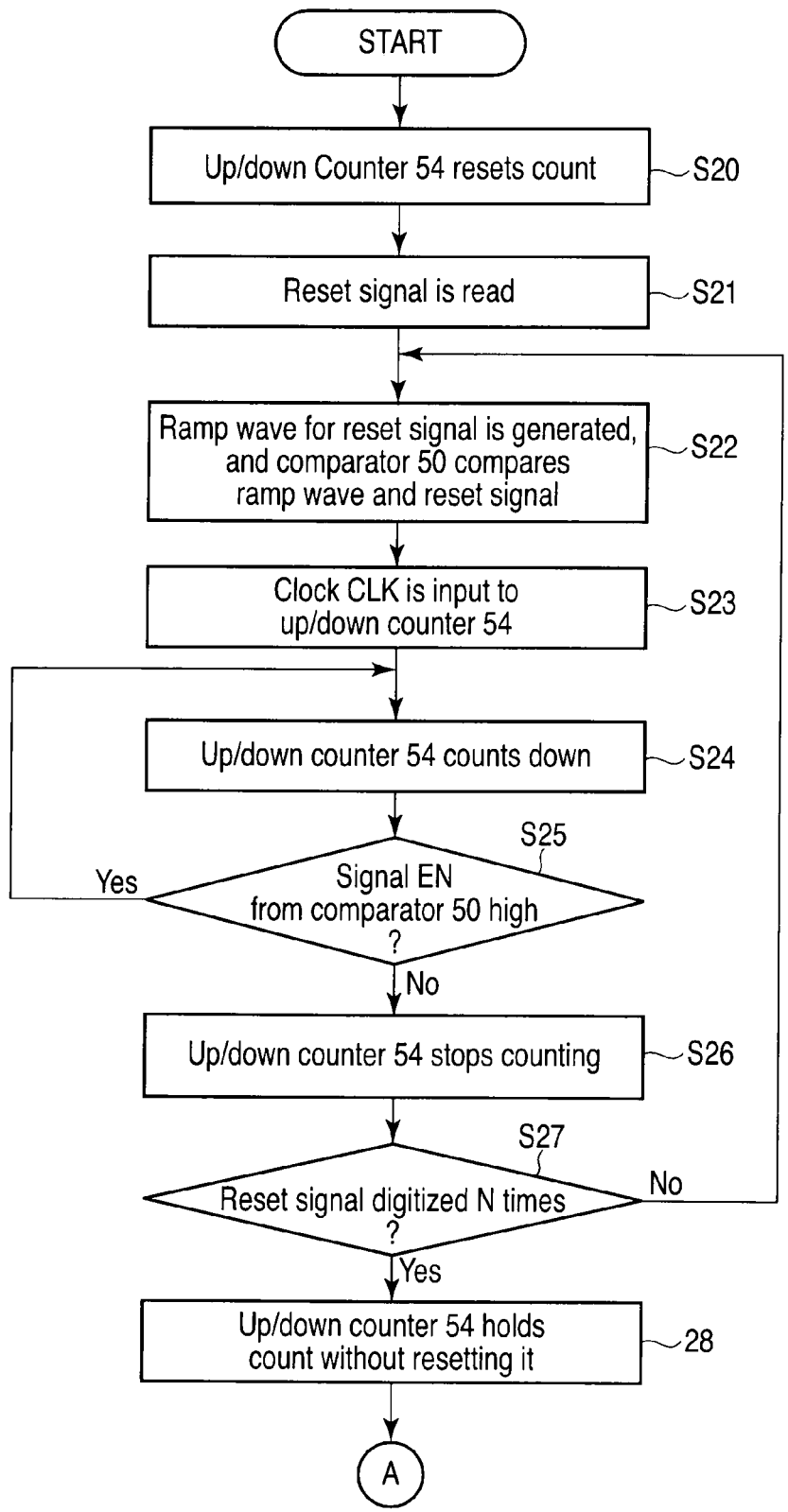
FIGS. 7A and 7B are a flowchart showing operation of the ADC section according to the second embodiment of the present invention.
Figure 7B:
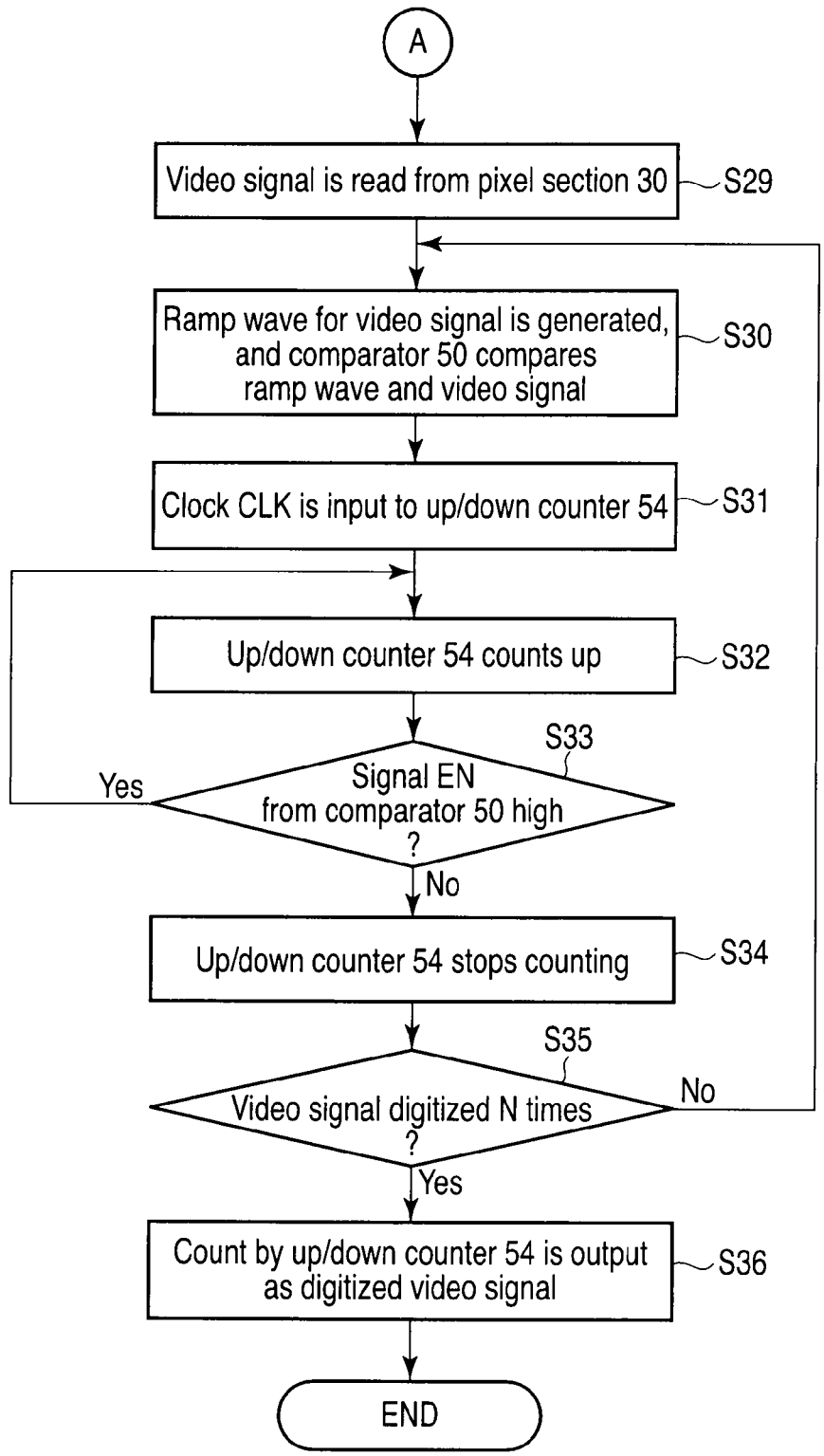

Digitization of the analog reset voltage and video signal by the solid-state imaging device according to the second embodiment will now be described with reference to FIGS. 7A and 7B. FIGS. 7A and 7B are a flowchart showing the flow of the digitization of the analog signal by the solid-state imaging device.

First, the ST 17 instructs the up/down counter 54 to reset the count. As a result, the up/down counter 54 sets the count to zero (FIG. 7A, step S20). Then, the reset signal is read from the pixel section 30, and the read reset signal is input to the inverting input of the comparator 50 (S21). The ramp wave generation circuit 18 generates the ramp wave for the reset signal to be output to the comparator 50. The comparator 50 compares the ramp wave for the reset signal and the reset signal (S22). The clock signal CLK is output to the up/down counter 54 from, for example, the ST 17 (S23). The up/down counter 54 functions as a downcounter, and counts down in synchronization with the clock signal CLK (S24). Specifically, when signal EN output from the comparator 50 is high (S25, YES), the up/down counter 54 counts down in synchronization with the clock signal CLK (S24). Conversely, when signal EN is low, the up/down counter 54 stops the digitization (S26). Accordingly, the up/down counter 54 stops the countdown. The ST 17 determines whether the reset signal has been digitized N times (S27). If it is determined that the reset signal has not been digitized N times in step S27 (S27, NO), the processing returns to step S22 and repeats above-mentioned steps. If it is determined that the reset signal has been digitized N times in step S27 (S27, YES), the ST 17 instructs the up/down counter 54 to hold the count up to that time without resetting it (S28).

Then, the video signal is read from the pixel section 30. The read video signal is input to the inverting input of the comparator 50 (FIG. 7B, S29). The ramp wave generation circuit 18 generates the ramp wave for the video signal output to the comparator 50. The comparator 50 compares the ramp wave for the video signal and the video signal (S30). The clock signal CLK is output to the up/down counter 54 from, for example, the ST 17 (S31). The up/down counter 54 functions as an upcounter, and counts up in synchronization with the clock signal CLK (S32). Specifically, when signal EN output from the comparator 50 is high (S33, YES), the up/down counter 54 counts up in synchronization with the clock signal CLK (S32). Conversely, when signal EN is low, the up/down counter 54 stops the digitization (S34). Accordingly, the up/down counter 54 stops the count-up. The ST 17 determines whether the video signal has been digitized N times (S35). If it is determined in step S35 that the video signal has not been digitized N times (S35, NO), the processing returns to step S30 and repeats above-mentioned steps. Conversely, if it is determined in step S35 that the video signal has been digitized N times (S35, YES), or the number of times of digitization of the video signal and that of the reset signal is the same, the ST 17 outputs the count counted by the up/down counter 54 as a digital signal of the video signal (S36).

<Operation of Solid-State Imaging Device>

Figure 8:
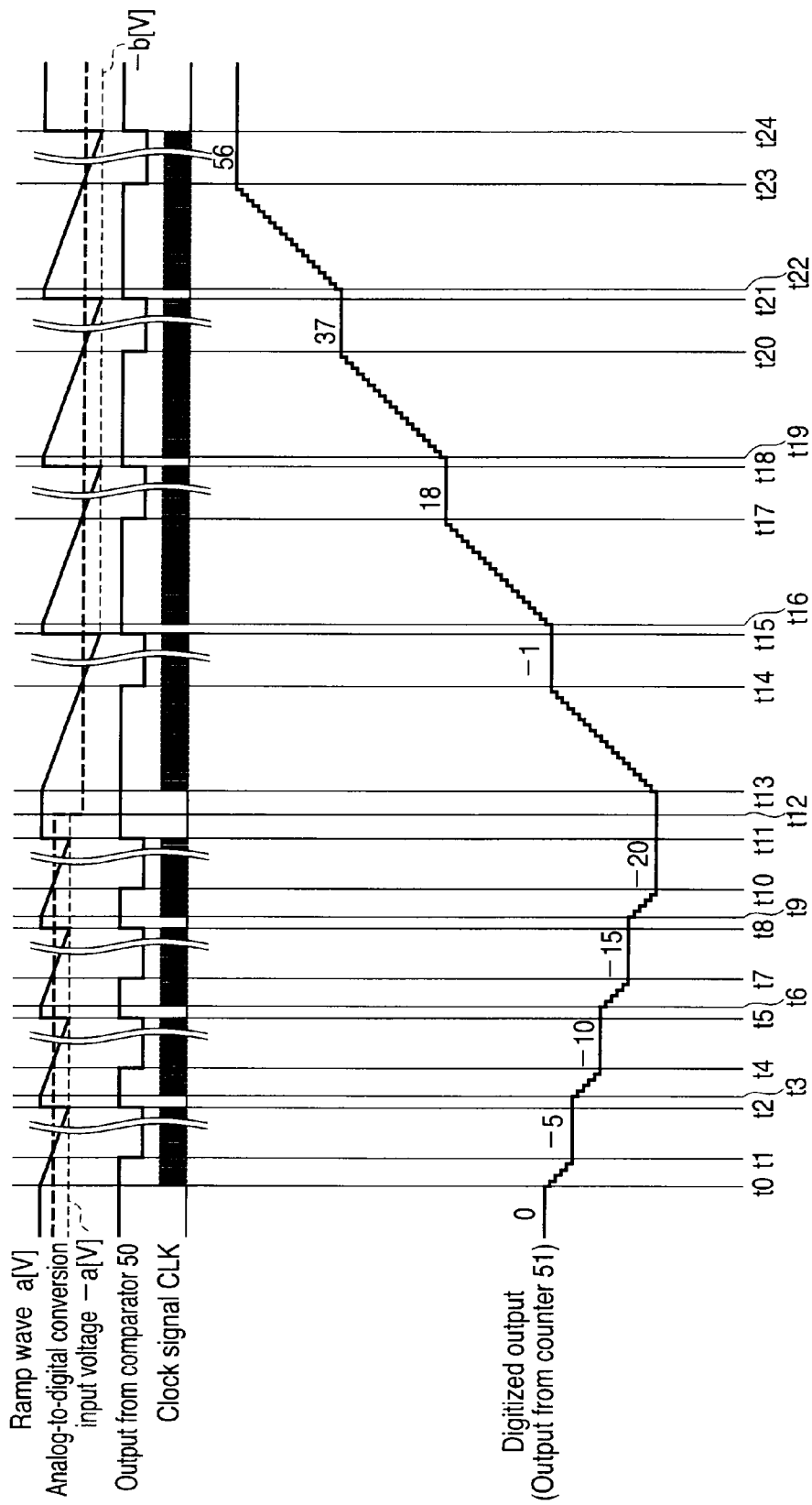
FIG. 8 is a timing chart showing operation of the solid-state imaging device according to the second embodiment of the present invention.

Operation by the solid-state imaging device including the ADC section 31 will now be described with reference to FIG. 8. FIG. 8 is a timing chart showing four digitizations of each of the analog reset voltage and video signal voltage which are output to the ADC section 31 from the pixel section 30 as FIG. 4 for the modified first embodiment. The ADC section 31 according to the second embodiment outputs the ramp wave four times for each of the video signal voltage and reset voltage to convert each voltage into an 8-bit digital quantity. That is, the ADC section 31 carries out a quadruplex digital double sampling. The vertical axis represents the output of the ramp wave generation circuit 18, reset voltage and video signal (indicated in the figure as an analog-to-digital conversion input voltage) which are output from the pixel section 30, clock signal CLK of the VCOPLL 10, and output from the up/down counter 54. The horizontal axis represents time. Only operation of the solid-state imaging device different from that described with reference to FIG. 4 will be described in the following.

The solid-state imaging device according to the second embodiment includes the ADC section 31 described with reference to FIG. 6. When the up/down counter 54 receives a high signal from the comparator 50, it counts up or counts down as required.

As shown, first, at time t0, the reset voltage is read from the pixel section 30, and the ramp wave generation circuit 18 generates the ramp wave. Then, the ADC section 31 digitizes the reset voltage. Specifically, processing from steps S20 to S28 described with reference to FIG. 7A is performed. That is, at time t0, the up/down counter 54 is functioning as a downcounter. After the counter 51 is reset to zero by reception of the reset command from the ST 17, the first digitization is performed from time t0 to time t3. As a result, the up/down counter 54 counts down to −5 until time t1 when signal EN output from the comparator 50 is made low. Here, the digitization of the reset voltage is completed.

Then, the operation from time t0 to time t3 (digitization of the analog reset voltage in the period from time t0 to time t1) is repeated several times (for example, three times). That is, the ramp wave generation circuit 18 outputs the ramp wave for the reset voltage three times under control of the ST 17 from time t3 to time t11 as the operation to time t0 to time t3. That is, the ramp wave generation circuit 18 carries out the sweep of the ramp wave three times under control of the ST 17. Then, the up/down counter 54 keeps counting in accordance with the clock signal CLK during each period until the ramp wave becomes the same as the reset voltage. The up/down counter 54 accumulates the count up to that time without resetting it. Specifically, the up/down counter 54 counts down by −5 during each period of times t0 to t1, t3 to t4, t6 to t7, and t9 to t10 for which the output of the comparator 50 remains high. As a result, the up/down counter 54 has a count of −20 at time t10.

Then, the up/down counter 54 does not reset the count of −20 up to that time and functions as an upcounter for the video signal. Specifically, the up/down counter 54 uses −20 as an initial value to count up by 19 for every reception of the high signal from the comparator 50. In the following, reading of the video signal voltage from the pixel section 30 under control of the ST 17 after time t12 will be described.

At time t12, the video signal voltage is read from the pixel section 30, and the ramp wave generation circuit 18 generates the ramp wave. Then, the ADC section 31 digitizes the video signal voltage. Specifically, processing from steps S29 to S36 described with reference to FIG. 7B is performed. Namely, the ramp wave starts decreasing from time t13 under control of the ST 17, and becomes the same as the potential of the video signal at time t14. When the ramp wave becomes smaller than the reset voltage, the comparator 50 outputs a low signal EN to the up/down counter 54. As a result, the up/down counter 54 stop the count-up. As mentioned above, since the up/down counter 54 uses −20 as an initial value to count up by 19, the up/down counter 54 now has a count of −1. Here, the digitization of the video signal voltage by the ADC section 31 is completed.

Then, the operation from time t13 to time t16 (digitization of the analog video signal voltage in the period from time t13 to time t14) is repeated several times (for example, three times). That is, the ramp wave generation circuit 18 outputs the ramp wave for the video signal voltage three times from time t16 and t24. Then, the up/down counter 54 continues the count-up in accordance with the clock signal CLK during each period in which the ramp wave is larger than the video signal voltage. That is, the up/down counter 54 accumulates the count up to that time without resetting it. Specifically, the up/down counter 54 counts down by 19 during each period of times t13 to t14, t16 to t17, t19 to t20, and t22 to t23 for which the output of the comparator 50 remains high. Then, the up/down counter 54 outputs an accumulated count of 56 as a digital quantity of the video signal. Note that the ADC section 31 in the solid-state imaging device according to the second embodiment is also applicable to the count of 76 and −20. Description of this application is omitted.

<Advantage According to the Second Embodiment>

The analog-to-digital converter and solid-state imaging device including the same according to the second embodiment can reduce thermal noise and improve the signal-to-noise ratio as well as offer advantages 1 and 2, above. Furthermore, the ADC section 31 according to the second embodiment does not include the register 52 and computing element 53 in the ADC section 31 of the first embodiment, and uses the up/down counter 54 instead of the counter 51 to realize reduction in circuit structure size and simplification of the circuit control.

Note that although the same number of times of the sampling of the reset voltage and video signal voltage by the ADC section 31 is described, the ramp wave generation circuit 18 does not necessarily need to output the ramp wave for the reset signal and video signal voltage the same number of times. For example, one output of the ramp wave to the reset voltage and four outputs to the video signal are possible. In this case, the digital signal obtained by the sampling of the reset signal needs to be quadrupled.

The present invention is not limited to the embodiments described herein and can be variously modified at the practical stages as long as it does not deviate from the essence. Embodiments include inventions at various stages, and various inventions can be extracted from appropriate combinations of the components disclosed herein. For example, even if some components are omitted from all the components shown in the embodiments, if the problem indicated herein can be solved and the advantage presented herein can be obtained, the configuration obtained without these components can be extracted as an invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An analog-to-digital converter which
receives a first analog signal voltage and a second analog signal voltage,
receives a first comparison voltage which decreases by a fixed inclination with time from a first reference voltage larger than the first analog signal voltage to a voltage smaller than the first analog signal voltage,
receives a second comparison voltage which decreases by the same inclination as the first comparison voltage with time from a second reference voltage larger than the second analog signal voltage to a voltage smaller than the second analog signal voltage,
counts cumulatively over first periods to acquire a first result, wherein each of the first periods is time required for the first comparison voltage to change from the first reference voltage to the same voltage as the first analog signal voltage,
counts cumulatively over second periods to acquire a second result, wherein each of the second periods is time required for the second comparison voltage to change from the second reference voltage to the same voltage as the second analog signal voltage, and
outputs a difference between the first result and the second result as a digital quantity.

2. The converter according to claim 1, wherein the number of the second periods is the same as the number of the first periods.

3. The converter according to claim 1 comprising:
a comparator which compares the first comparison voltage with the first analog signal voltage to output a first comparison result, and compares the second comparison voltage with the second analog signal voltage to output a second comparison result;
a counter which uses the first comparison result to count cumulatively over the first periods to obtain the first result, uses the second comparison result to cumulatively count over the second periods to obtain the second result, and outputs the first result and the second result;
a computing element which calculates a difference between the first result and the second result; and
a register which holds the first result, outputs the first result to the computing element, and holds the difference, wherein
the computing element outputs the first result from the counter to the register, and then calculates a difference between the second result of the counter and the first result from the register, and
the register holds the first result from the computing element, then holds the difference, and outputs the difference as a digital quantity of a difference between the first analog signal voltage and the second analog signal voltage.

4. The converter according to claim 3, wherein the number of the second periods is the same as the number of the first periods.

5. The converter according to claim 3, wherein
each of the first periods is equal to a period for which the comparator continues to output the first comparison result which indicates that the first comparison voltage is larger than the first analog signal voltage, and
each of the second period is equal to a period for which the comparator continues to output the second comparison result which indicates that the second comparison voltage is larger than the second analog signal voltage.

6. A solid-state imaging device comprising:
an analog-to-digital converter of claim 3;
a pixel section which generates a reset signal as the first analog signal voltage, and generates a video signal as the second analog signal voltage;
a voltage generation circuit which generates the first comparison voltage and the second comparison voltage; and
a controller which instructs the voltage generation circuit to generate the first comparison voltage and the second comparison voltage for each of the reset signal and the video signal multiple times.

7. The converter according to claim 1 comprising:
a comparator which compares the first comparison voltage with the first analog signal voltage to output a first comparison result, and compares the second comparison voltage with the second analog signal voltage to output a second comparison result;
a counter which functions as an upcounter for one of the first analog signal voltage and the second analog signal voltage and as a downcounter for the other of the first analog signal voltage and the second analog signal voltage, uses the first comparison result to count cumulatively over the first periods to obtain the first result, uses the first result as an initial value and the second comparison result to count cumulatively over the second periods to obtain the second result, and outputs the second result as a digital quantity of a difference between the first analog signal voltage and the second analog signal voltage.

8. The converter according to claim 7, wherein the number of the second periods is the same as the number of the first periods.

9. The converter according to claim 7, wherein the counter functions as a downcounter for the first analog signal voltage and as an upcounter for the second analog signal voltage.

10. A solid-state imaging device comprising:
   an analog-to-digital converter of claim 1;
   a pixel section which generates a reset signal as the first analog signal voltage, and generates a video signal as the second analog signal voltage;
   a voltage generation circuit which generates the first comparison voltage and the second comparison voltage; and
   a controller which instructs the voltage generation circuit to generate the first comparison voltage and the second comparison voltage for each of the reset signal and the video signal multiple times.

11. A method of digitizing an analog signal comprising:
   reading out a first analog signal;
   comparing the first analog signal with a first comparison voltage which decreases by a fixed inclination with time from a first reference voltage larger than a voltage of the first analog signal to a voltage smaller than the voltage of the first analog signal;
   counting cumulatively over first periods to acquire a first result, each of the first periods being time required for the first comparison voltage to change from the first reference voltage to the same voltage as the first analog signal;
   reading out a second analog signal;
   comparing the second analog signal with a second comparison voltage which decreases by the same inclination as the first comparison voltage with time from a second reference voltage larger than a voltage of the second analog signal to a voltage smaller than the voltage of the second analog signal;
   counting cumulatively over second periods to acquire a second result, each of the second periods being time required for the second comparison voltage to change from the second reference voltage to the same voltage as the second analog signal; and
   outputting a difference between the first result and the second result as a digital quantity.

12. The method according to claim 11, wherein the number of the second periods is the same as the number of the first periods.

13. The method according to claim 11 further comprising holding the first result at a register, and wherein
   the outputting a difference between the first result and the second result comprises:
   reading out the first result from the register; and
   outputting the first result subtracted by the second result as the difference.

14. The method according to claim 11, wherein
   the first analog signal comprises a reset signal generated in a pixel section of a solid-imaging device, and
   the second analog signal comprises a video signal generated in the pixel section.

15. The method according to claim 11, wherein
   the counting cumulatively over first periods comprises performing one of up-counting and down-counting cumulatively over the first periods,
   the counting cumulatively over second periods comprises performing the other one of up-counting and down-counting cumulatively over the second periods with the first result used as an initial value, and
   the outputting a difference between the first result and the second result comprises outputting the second result.

16. The method according to claim 15, wherein the number of the second periods is the same as the number of the first periods.

17. The method according to claim 15, wherein
   the counting cumulatively over first periods comprises counting down cumulatively over the first periods, and
   the counting cumulatively over second periods comprises counting up cumulatively over the second periods with the first result used as an initial value.

* * * * *